United States Patent [19]
Kong

[11] Patent Number: 6,005,253
[45] Date of Patent: Dec. 21, 1999

[54] SCANNING ENERGY IMPLANTATION

[75] Inventor: Sik On Kong, Singapore, Singapore

[73] Assignee: Chartered Semiconductor Manufacturing, Ltd., Singapore, Singapore

[21] Appl. No.: 09/072,002

[22] Filed: May 4, 1998

[51] Int. Cl.[6] .................................................. H01J 37/302
[52] U.S. Cl. ..................................... 250/492.21; 250/398
[58] Field of Search .............................. 250/492.21, 398, 250/251, 423 R

[56]           References Cited

U.S. PATENT DOCUMENTS

| | | | |
|---|---|---|---|
| 3,660,735 | 5/1972 | McKougall | 257/387 |
| 3,831,025 | 8/1974 | Wiley et al. | 250/294 |
| 4,410,611 | 10/1983 | Maciver | 430/5 |
| 4,732,869 | 3/1988 | Attekum et al. | 437/34 |
| 4,831,270 | 5/1989 | Weisenberger | 250/492.2 |
| 5,420,437 | 5/1995 | Siess | 250/492.3 |
| 5,481,116 | 1/1996 | Glavish et al. | 250/396 |
| 5,672,879 | 9/1997 | Glavish | 250/396 |
| 5,780,862 | 7/1998 | Siess | 250/492.3 |

*Primary Examiner*—Bruce C. Anderson
*Attorney, Agent, or Firm*—George O. Saile; Rosemary L.S. Pike

[57]           ABSTRACT

A process is described for generating, through ion implantation, any desired concentration profile. This is accomplished by providing a set of mono-energetic doping concentration profiles which, when superimposed, generate the desired concentration profile (in a manner analogous to generating a square wave by superimposing multiple sine waves). The ion current, accelerating voltage, and dose needed to generate each member of the set is then computed and fed as input to software that controls the operation of the implanter. The various profiles from the set are then implemented while the ion beam remains stationary, thereby generating the desired profile at that spot. The beam is then moved to the next intended location and the process is repeated. In an alternative embodiment, each profile in the set is implemented over the entire surface scanned by the beam and then the process is successively repeated for the remaining members of the set.

16 Claims, 1 Drawing Sheet

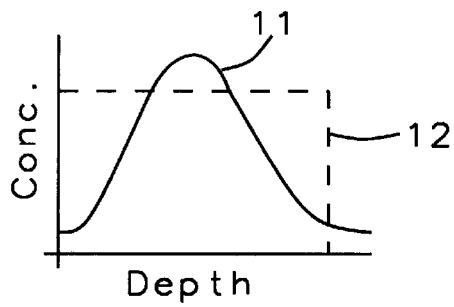
FIG. 1 – Prior Art
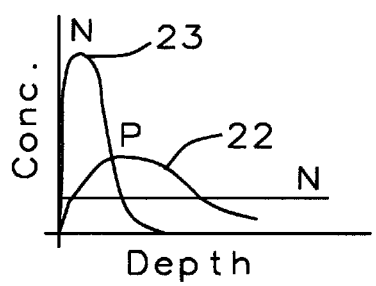
FIG. 2 – Prior Art
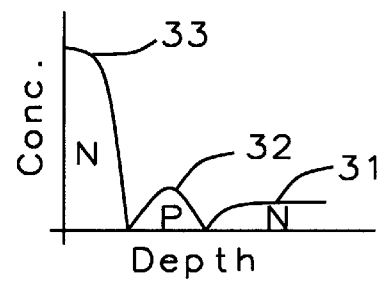
FIG. 3 – Prior Art
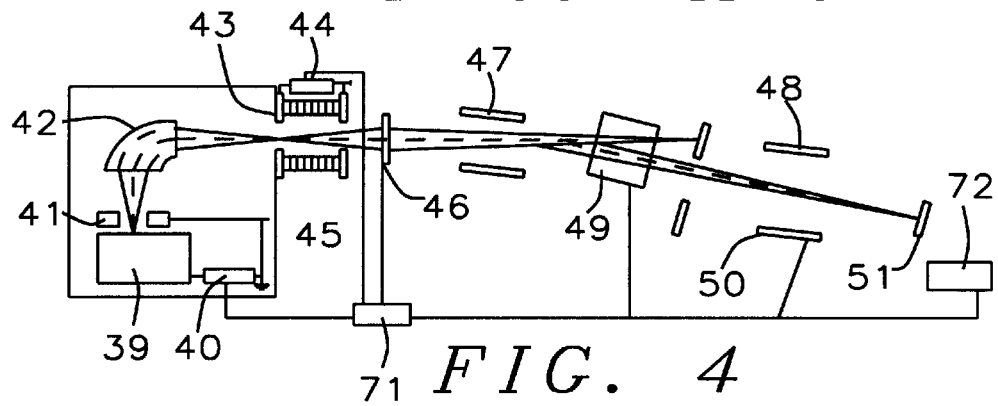
FIG. 4
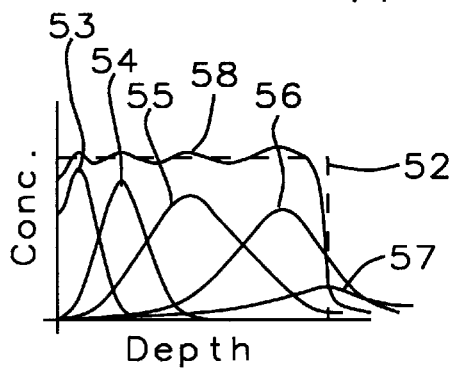
FIG. 5
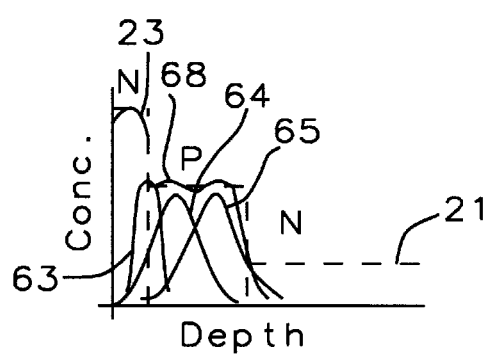
FIG. 6

SCANNING ENERGY IMPLANTATION

FIELD OF THE INVENTION

The invention relates to the general field of ion implantation during integrated circuit manufacture with particular reference to the control of dopant concentration.

BACKGROUND OF THE INVENTION

For many years now, ion implantation has been used to great effect for the controlled doping of semiconductors. The material to be implanted is first ionized, an ion current is extracted from the ion source and the ions are accelerated by the application of high voltage to form a beam that strikes the target (normally a semiconductor wafer) wherever intended. Depending on their arrival energy, the ions will penetrate some distance below the surface of the target before coming to rest, usually in interstitial positions within the semiconductor lattice where they are inactive. This is normally followed by a rapid thermal anneal (RTA) step during which the implanted donor and/or acceptor ions migrate to nearby substitutional locations in the lattice and become active there.

Referring now to FIG. 1 we show there a schematic plot of concentration (of implanted species) as a function of depth (below the semiconductor surface). Curve 11 represents the form obtained from implanting a single ion species all of whom arrive at the surface with the same energy. Exactly how far any given ion penetrates will vary, depending on exactly where the incoming ion enters the lattice. For example, an ion that collides head-on with a lattice atom may be reflected back from the surface or it may be deflected sideways and follow a path that is more nearly parallel to the semiconductor surface than normal to it. Alternatively, an ion arriving between two lattice atoms may, in some cases, find itself in an intra-lattice channel and continue for a substantial distance before coming to equilibrium.

Thus, as seen in curve 11, the concentration profile that results from conventional ion implantation has the shape of a distribution curve that peaks at a depth corresponding to the magnitude of the acceleration voltage that was applied to the beam. For the purpose of optimizing the electrical performance of devices the idealized concentration profile (obtainable by simulation) is, in general, different from the actual implantation distribution curve. For example, the ideal curve for a particular device might be as outlined by dashed line 12, i.e. flat out to the desired depth and then falling to zero beyond it. A straignt profile of this sort cannot be obtained from one implantation.

FIG. 2 illustrates the individual implantation profiles that are typically achieved in the formation of an NPN bipolar transistor. Curve 21 is flat as it represents the profile of the bulk N-type semiconductor material itself. A layer of P-type material was then implanted (to form the base region) and had a profile corresponding to curve 22. Finally, the emitter region was formed and had a profile corresponding to curve 23.

At any given depth, the contributions to the conductivity from all the various implants at that depth add up, with N and P dopants cancelling one another. Thus, the final concentration profile has the appearance shown in FIG. 3, with net conductivity due to either species gradually reaching zero as the actual P-N junctions (between 31 and 32 or 32 and 33) are approached. In an ideal device the concentrations would remain constant until the junction was reached and then would immmediatedly change to the opposite conductivity type. It would therefore be a distinct advance in the device fabrication art if concentration profiles could be tailored into any desired form, particularly flat profiles.

After searching the prior art, we were unable to find any references that teach the formation of custom profiles through ion implantation. References that we found to be of interest include Glavish (U.S. Pat. No. 5,481,116 January 1996 and U.S. Pat. No. 5,672,879 September 1997) who discloses systems and methods for generating time varying magnetic fields. These systems are used, inter alia, for magnetically scanning an ion beam and an ion implantation system.

Weisenberger (U.S. Pat. No. 4,831,270 May 1989) describes an ion implantation system that is well suited to treating a large number of wafers at a time without being subject to charge buildup problems.

SUMMARY OF THE INVENTION

It has been an object of the present invention to provide a process whereby concentration profiles due to ion implantation can be tailored to specific shapes.

A further object of the invention has been to provide a concentration profile (due to ion implantation) that is flat.

Yet another object has been to provide PN junctions in which dopant concentration remains constant right to the junction's edge.

A still further object has been that said process be implementable with only minor modification of existing ion implanters and with little or no increase in the cost of ion implantation.

These objects have been achieved by first providing a set of mono-energetic doping concentration profiles which, when super-imposed, generate the desired concentration profile. The ion current, accelerating voltage, and dose needed to generate each member of the set is then computed and fed as input to software that controls the operation of the implanter. The various profiles from the set are then implemented while the ion beam remains stationary, thereby generating the desired profile at that spot. The beam is then moved to the next intended location and the process is repeated. In an alternative embodiment, each profile in the set is implemented over the entire surface scanned by the beam and then the process is repeated for the remaining members of the set.

BRIEF DESCRIPTION OF THE DRAWINGS

FIG. 1 illustrates a typical concentration vs. depth profile that results from conventional ion implantation.

FIG. 2 shows concentration profiles for the three layers that comprise a conventional NPN bipolar transistor.

FIG. 3 shows the resulting profiles after overlapping portions of the profiles of FIG. 2 have been algebraically summed.

FIG. 4 is a diagram of a conventional ion accelerator as modified to serve the needs of the present invention.

FIGS. 5 and 6 illustrate how multiple mono-energetic profiles may be combined to produce specific profiles of particular shapes (such as flat).

DESCRIPTION OF THE PREFERRED EMBODIMENTS

The present invention describes a process whereby a specific predetermined concentration profile can be implemented by means of ion implantation. In FIG. 4 we show a conventional ion beam generator which has been modified to serve the needs of the present invention.

Ion source 39 is a glow discharge chamber that includes ions of the species that is to be implanted. These include donors such as arsenic and phosphorus, acceptors such as aluminum, gallium, indium, and boron, as well ions needed for specific purposes, such as silicon (to replenish silicon lost during silicidation), germanium, hydrogen, oxygen, and nitrogen. Said ions are extracted from the ion source by means of gate electrode 41, biassed about 20 kV negative, relative to the ion source, by power supply 40. The extracted ions pass through analyzing magnet 42 which is adjusted to provide a magnetic field that focusses only ions of a preselected atomic weight at the center of aperture 43.

Thus, only ions of the chosen mass enter accelerating tube 45 where they are energized to the desired level from power supply 44 which is capable of providing voltages between about 10 kV and 5 MV. The magnitude of the ion current after it emerges on the far side of 45 is typically between about 1 $\mu$A and 100 mA. The beam is refocussed by focussing coil 46 after which it passes through electrostatic beam gate 47 where it is deflected to one side for the purpose of separating out any neutral species in the beam. These continue in a straight line to be caught at trap 48 which also serves as an aperture for the ion beam itself. Y and X plane scanning electrodes, 49 and 50 respectively, allow the position of the beam at target 51 to be changed as needed. Magnetic coils could also be used for neam steering.

Central to our modification of the standard accelerator system described thus far is control computer 71. This device is connected to power supply 40 so that it may control the extracted ion beam current, to power supply 44 to control the acceleration voltage to focussing coil 46, so that it can maintain the focus as the energy of the ion beam changes, to Y and X plates 49 and 50 (or magnetic coils) so that it can control where and how the beam is scanned as well as to maintain the scanning amplitude when the energy of the ion beam changes, and to dose monitor 72 where the accumulated dose of ions at the target is measured and computed by integrating the current over time and dividing by the charge of the ion species.

As was discued in the background section, the concentration profile obtained from a conventional ion impantation run is bell shaped, as exemplified in curve 11 of FIG. 1. In order to provide profiles having some other shape (in particular a flat profile as exemplified in curve 12 of FIG. 1), it is necessary to combine multiple conventional concentration profiles. Since such profiles derive from ions that all have the same energy, we will refer to them as monoenergetic concentration profiles.

In a manner analogous to the formation of square waves by the super-position of multiple sine waves, a close approximation to any specific concentration profile can be achieved by combining multiple mono-energetic profiles. Typically, between about 2 and 1,000 individual profiles need to be combined to achieve satifactory specific profiles. This is illustrated in FIG. 5 where specific profile 52 is closely approximated by combining 4 mono-energetic profiles 53–56 of the same conductivity type with one monoenergetic profile 57 of the opposite type. The latter is needed to cancel the contribution made by the tail-end of curve 56. As can be seen, profile 58, which is the sum of all the mono-energetic profiles, fits curve 52 quite well. Typically, flat profiles of this type will extend to a depth between about 0.1 and 2 microns, The accelerating voltage, ion current, and dose needed for each mono-energetic implant have been computed using proprietary algorithms but they could also have been generated by hand by using trial and error in combination with simulation. Regardless of how the mono-energetic profiles are selected, once they are known they will be used to drive the control software in computer 71 (FIG. 4).

In a first embodiment of the invention, the full specific concentration profile is generated while the ion beam remains aimed at a fixed location on the surface of the semiconductor (normally a wafer of a material such as silicon, germanium, gallium arsenide, silicon-germanium, silicon carbide, aluminum gallium arsenide or any of the 3–5 or 2–6 semiconductors. This is achieved by successively changing the ion current, voltage, and dose (under computer control) until all the required mono-energetic profiles have been implemented. Only then is the ion beam moved to a different location on the semiconductor surface where the entire sequence is repeated. The advantages of implementing the specific profile in this manner are that it can implant different profiles in different areas of the wafer, while the disadvantages are that the write time will be long.

In a second embodiment of the invention, only a single mono-energetic profile is implemented before the ion beam is moved to its next location. Once all intended locations have been implanted, the beam is returned to its starting position and another, not yet implemented, mono-energetic profile is implemented at all locations, this being repeated until all the mono-energetic profiles have been included. The advantages of implementing the specific profile in this manner are that it provides a fast implantation cycle time with good profile control, while the disadvantages are that the same implantation profile must be used throughout the wafer.

In FIG. 6 we illustrate how the concentration profiles for an NPN transistor that is closer to the ideal than the state of the art profiles seen in FIG. 3, can be achieved. Profiles 21 and 23 have not been changed but, to achieve a near-flat profile for the P-type base region, three mono-energetic profiles, 63, 64, and 65, have been used in place of the single conventional profile 22 seen in FIG. 2. The resulting profile 68 is seen to be almost flat.

While the invention has been particularly shown and described with reference to the preferred embodiments thereof, it will be understood by those skilled in the art that various changes in form and details may be made without departing from the spirit and scope of the invention.

What is claimed is:

1. A process for implanting ions in a semiconductor body according to a specific concentration profile, comprising the steps of:

(a) providing an ion implantation system, having an ion current and an accelerating voltage, that produces an ion beam;

(b) providing a software program for controlling the ion implantation system;

(c) computing a set of mono-energetic doping concentration profiles which, when superimposed, generate said specific concentration profile;

(d) computing the ion current, accelerating voltage, and dose needed to generate each mono-energetic doping concentration in the set;

(e) under control of the software, successively implementing each of the mono-energetic concentration profiles in the set, thereby implementing the specific concentration profile; and (f) then moving the ion beam to an unimplanted area of the semiconductor and repeating steps (e) and (f) until the specific concentration profile has been implanted wherever so intended in the semiconductor.

2. The process of claim 1 wherein the ion current is between about 0.1 µA and 500 mA.

3. The process of claim 1 wherein the accelerating voltage is between about 5 and 5,000 kV.

4. The process of claim 1 wherein the doses are between about $10^9$ and $10^{18}$ ions/sq. cm.

5. The process of claim 1 wherein the specific concentration profile is approximately flat to a depth between about 0.1 and 2 microns.

6. The process of claim 1 wherein the number of mono-energetic doping concentration profiles which, when superimposed, generate a specific concentration profile is between about 2 and 1,000.

7. The process of claim 1 wherein the semiconductor body is selected from the group consisting of silicon, germanium, gallium arsenide, silicon-germanium, silicon carbide, aluminum gallium arsenide all 3–5 semiconductors, and all 2–6 semiconductors.

8. The process of claim 1 wherein the ions are selected from the group consisting of donors, acceptors, silicon, germanium, hydrogen, oxygen, and nitrogen.

9. A process for implanting ions in a semiconductor body according to a specific concentration profile, comprising the steps of:

(a) providing an ion implantation system, having an ion current and an accelerating voltage, that produces an ion beam of lesser area than the semiconductor body;

(b) providing a software program for controlling the ion implantation system;

(c) computing a set of mono-energetic doping concentration profiles which, when superimposed, generate said specific concentration profile;

(d) computing the ion current, accelerating voltage, and dose needed to generate each mono-energetic doping concentration in the set;

(e) under control of the software, selecting from the set a particular mono-energetic concentration profile that has not been previously selected and then implementing said particular profile;

(f) then moving the ion beam to an area of the semiconductor where said particular mono-energetic concentration profile has not been previously implemented;

(g) repeating steps (e) and (f) until the particular mono-energetic concentration profile has been implemented wherever so intended in the semiconductor; and (h) repeating steps (e), (f), and (g) until all mono-energetic profiles have been selected and implemented wherever so intended in the semiconductor, thereby implementing the specific concentration profile wherever so intended in the semiconductor.

10. The process of claim 9 wherein the ion current is between about 0.1 µA and 500 mA.

11. The process of claim 9 wherein the accelerating voltage is between about 5 and 5,000 kV.

12. The process of claim 9 wherein the doses are between about $10^9$ and $10^{18}$ ions/sq. cm.

13. The process of claim 9 wherein the specific concentration profile is approximately flat to a depth between about 0.1 and 2 microns.

14. The process of claim 9 wherein the number of mono-energetic doping concentration profiles which, when superimposed, generate a specific concentration profile is between about 2 and 3,000.

15. The process of claim 9 wherein the semiconductor body is selected from the group consisting of silicon, germanium, gallium arsenide, silicon-germanium, silicon carbide, aluminum gallium arsenide all 3–5 semiconductors, and all 2–6 semiconductors.

16. The process of claim 9 wherein the ions are selected from the group consisting of donors, acceptors, silicon germanium, hydrogen, oxygen, and nitrogen.

* * * * *